US012782817B2

(12) United States Patent
Stuart et al.

(10) Patent No.: US 12,782,817 B2
(45) Date of Patent: Nov. 3, 2026

(54) PATTERNED DARK MIRROR COATINGS FOR MULTI-FUNCTIONAL OPTICS

(71) Applicant: The Aerospace Corporation, El Segundo, CA (US)

(72) Inventors: Sean C. Stuart, Hawthorne, CA (US); Frank Pan, Los Angeles, CA (US); Peter D. Fuqua, Redondo Beach, CA (US); Adam G. Vore, Los Angeles, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 592 days.

(21) Appl. No.: 18/450,932

(22) Filed: Aug. 16, 2023

(65) Prior Publication Data

US 2024/0419076 A1 Dec. 19, 2024

Related U.S. Application Data

(60) Provisional application No. 63/508,603, filed on Jun. 16, 2023.

(51) Int. Cl.

| | |
|---|---|
| ***G03F 7/16*** | (2006.01) |
| ***G03F 7/00*** | (2006.01) |
| ***G03F 7/075*** | (2006.01) |

(52) U.S. Cl.

CPC ............ *G03F 7/162* (2013.01); *G03F 7/0005* (2013.01); *G03F 7/0755* (2013.01); *G03F 7/168* (2013.01)

(58) Field of Classification Search

CPC ...... G03F 7/162; G03F 7/0005; G03F 7/0755; G03F 7/168

See application file for complete search history.

(56) References Cited

U.S. PATENT DOCUMENTS

2012/0182606 A1* 7/2012 Weissenrieder .... G03F 7/70958 359/359
2024/0361496 A1* 10/2024 Zalkovskij ............ G03F 7/0005

OTHER PUBLICATIONS

Deposition Science, Inc., "Coating Technologies", https://www.depsci.com/coating-technologies/.

* cited by examiner

*Primary Examiner* — Stewart A Fraser
(74) *Attorney, Agent, or Firm* — LeonardPatel PC

(57) ABSTRACT

A patterned dark mirror coating is developed and fabricated for a custom spectrometer. By combining the photolithography process with a custom double-sided dark mirror coating integrated with a commercial infrared (IR) filter substrate, a multifunctional optical device is fabricated. The lithographic patterning of a dark mirror allows a single device to transmit light in a desired direction and absorb light everywhere else.

22 Claims, 8 Drawing Sheets

200

200

300

400

500

600

700

800

PATTERNED DARK MIRROR COATINGS FOR MULTI-FUNCTIONAL OPTICS

CROSS-REFERENCE TO RELATED APPLICATION

This application claims the benefit of, and priority to, U.S. provisional application No. 63/508,603, filed on Jun. 16, 2023. The subject matter of the earlier filed application is incorporated in its entirety by reference.

FIELD

The present invention relates to filters, and more particularly, to a bi-directional dark mirror coating, patterned by photolithography on an optical filter.

BACKGROUND

With respect to slit mask technology for space-based or terrestrial applications, the current state of the art involves micro-machining metals for slit masks. At the 1-100 micron width scale, diamond saws are used to cut slits in a metal to provide the smooth, straight lines required for spectrometer slit.

The machining methods commercially available do not handle curved lines at 10's of micron size scale, and are limited in the spacing between adjacent slits.

Common materials used in slit masks may not have the reflectance or transmissive properties required for certain applications, especially infrared.

Separate optical filters and slit masks are commonly used for spectrometers, combining these into one component has manufacturing and optical performance benefits. For example, by combining two components, a separate mounting assembly and alignment procedure is not necessary, reducing size, weight, and time. Optically, by placing the slit plane on the optical filter, a low incidence angle and telecentricity produce the minimum field-dependence on the band-pass edges.

Accordingly, an improved method for patterned dark mirror coating may be beneficial.

SUMMARY

Certain embodiments of the present invention may provide solutions to the problems and needs in the art that have not yet been fully identified, appreciated, or solved by current filter technologies. For example, some embodiments of the present invention pertain to a patterned dark mirror coating developed and fabricated for a custom spectrometer. By combining the photolithography process with a custom double-sided dark mirror co-substrate; integrated with a commercial infrared (IR) filter substrate, a multifunctional optical device may be fabricated that could not be obtained commercially. In some embodiments, the lithographic patterning of a dark mirror allows a single device to transmit light in a desired direction and absorb light everywhere else. This can form slit masks, polarizers or similar optical filters that transmit light in defined locations while absorbing stray light in a defined wavelength range.

In an embodiment, a method includes patterning one or more slits on a substrate with photolithography, cleaning and processing of the substrate, depositing dark mirror coatings, and removing photoresist in a lift-off procedure to reveal the slits in the dark mirror coating.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
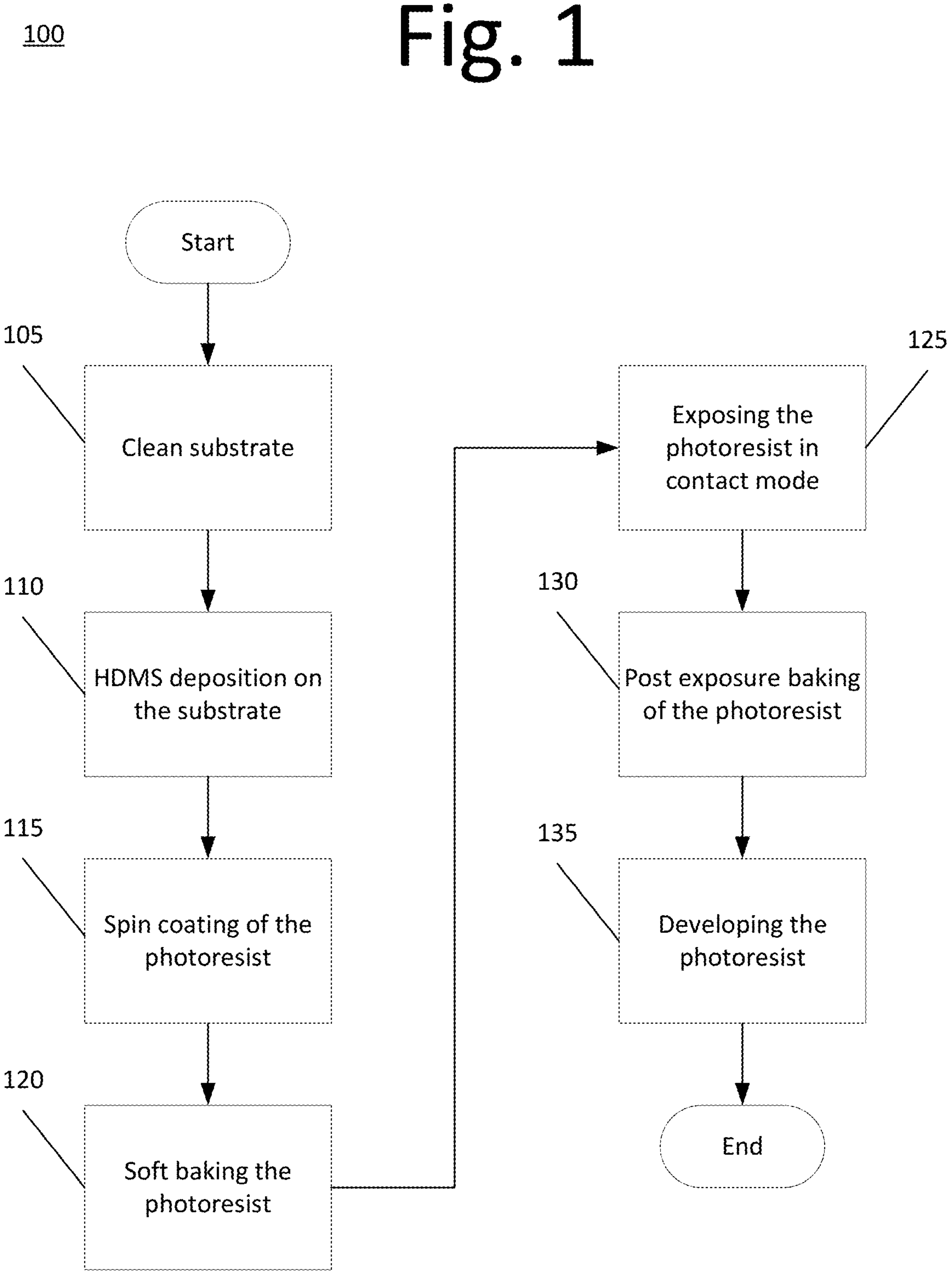
FIG. 1 is a diagram illustrating a method for using photolithography in conjunction with a substrate for the IR filter, according to an embodiment of the present invention.

Some embodiments of the present invention pertain to a patterned dark mirror coating developed and fabricated for a custom spectrometer.

Slit Design

A slit mask is required for a custom spectrometer. To meet the needs of a custom spectrometer, a slit mask has to perform functions simultaneously, i.e., transmit light in desired locations and at desired wavelengths, all while absorbing light in the transmitted wavelengths to prevent stray light from reaching the detector. More details on the reasons for these requirements are below.

To separate the spectra measured by adjacent slits, a band-pass filter is introduced to the system to reject out of band light, i.e., if unfiltered, the photons shorter than 600 nm produce signal on the same pixels used for sensing 1650 nm light on an adjacent slit. A band-pass filter is placed at the slit plane, because of the low incidence angle and telecentricity produces the minimum field-dependence on the band-pass edges.

Additionally, as part of the stray light analysis of the system, interaction of the slit plane and first lens in the spectrograph produced a stray re-imaging mode. To eliminate the stray re-imaging mode, a few design features may be added, e.g., high performance coatings to minimize reflectance from the lens, a modified prescription to defocus the ghost image, and minimization of the slit reflectance. Based on stray light analysis, reflectance of less than 2 percent must be achieved from the slit side facing the lens to bring ghost reflections to an acceptable level.

In previous instrument builds, the slits were fabricated using diamond turning. However, with producing five individual slits with the required alignment tolerance, the fabrication process became costly. For this reason, photolithography is used to produce the slits, but the engineering challenge of producing a suitable coating that achieved the necessary low reflectance still existed, since commercial recipes either produce reflective masks or are tuned to be dark only in the visible wavelengths.

Since mechanical air slits are risky, lithography-based solutions may be used. This may include E-beam lithography and photolithography. A more detailed explanation of Photolithography will be described below.

The choice of light-blocking material is also considered. A thin film of metal is a common choice; however, on an optically flat substrate this creates a very good mirror. IR absorbing paint may also be considered; however, the development of an etch/selective deposition method is not preferred. Various laser ablation or chemical roughening options may be considered; however, this may require extensive development time to tune the roughness and find subsequent coatings that would be absorbing in the IR. Instead, some embodiments utilize a custom dark mirror configuration. Since a dark-mirror coating includes several layers of oxides and metals, an etching process may be complicated, so a lift-off approach may be attempted for patterning. A more detailed explanation of the dark mirror modeling and deposition is described below.

Photolithography

The photolithography may be used with a customized recipe designed to accommodate the IR filters. Standard photolithography recipes are tuned to thin silicon wafers, which are significantly different optically and thermally than the IR filters used in this invention. Photoresist processing involves several heat treatments to prepare the polymer for exposure and development. If the photoresist does not reach the correct temperature throughout the film thickness, photoresist will not perform as required. The special photolithography processing below may not be required for thin substates but may be required for a 5 mm thick optic.

An oven may be used instead of the traditional hot plate to bake the photoresist. This may dramatically increase the recommended bake times to allow the sample to reach the desired temperature. The hot plate method, even with long times, may not be successful for these samples. With the hot plate method, the substrates being too thick and are thermally insulating, preventing the heat from transmitting to the photoresist.

FIG. 1 is a diagram illustrating method 100 for using photolithography in conjunction with a substrate for the IR filter, according to an embodiment of the present invention. In some embodiments, method 100 begins at 105 with cleaning the slit mask substrate (for example, an optical filter). This step includes 5 minutes sonication of the substrate in acetone, 5 minute sonication of the IR filter in isopropyl alcohol (IPA), de-ionized (DI) water rinse of the of the substrate, inspect for particulate or visual contamination, and if necessary, remove with oxygen plasma Asher for 10 minutes at 150 W, and if particulates, persist cleaning with detergent (e.g., liquinox 1% solution or similar) and repeat acetone/IPA/DI water rinse.

At 110, method 100 includes hexamethyldisiloxane (HDMS) deposition of the substrate. This includes baking the substrate at 140 C in a HDMS oven for 10 minutes (e.g., HDMS valve closed, under vacuum), open HDMS valve for additional 10 minutes, and allow the IR filter to cool ~10 minutes before photoresist application.

At 115, method 100 include spin coating of the substrate. This may include, for example, applying room temperature to the substrate, and applying the substrate on spin coater (e.g., 500 RPM, 500 R/S, 10 seconds, 2500 RPM; 500 R/S; 20 seconds, 500 RPM; 250 R/S; 5 seconds, and END). This procedure should be adjusted to produce a photoresist thickness >2× the film thickness to be deposited.

At 120, method 100 includes soft baking the substrate at 110 C for 60 minutes in nitrogen atmosphere, and at 125, exposing the substrate at 100 mJ/cm2 in contact mode. At 130, method 100 includes post exposure baking of the substrate for 16 minutes at 110 C in nitrogen atmosphere. At 135, method 100 include development of the photoresist. This may include 3 minutes of soaking the substrate in AZ 300 MIF developer. Then, the substrate is DI water rinsed, and N2 blow dried to remove residual water. Finally, 2 minutes of O2 plasma at 1 Torr and 100 W power is performed to remove trace photoresist and promote adhesion of dark mirror coating.

In some additional embodiments, dark mirror coating may be deposited in a separate procedure.

Following Dark mirror coating, the lift off procedure if performed with a soak in AZ 400 k Developer at 80° C. (undiluted) for ~2 hours until slits are completely exposed, and visual and 5× microscope inspection to confirm line width and quantify film defects.

It should be appreciated that an important part of this photoresist processing is substrate cleaning. The substrates are not meant for film deposition or photoresist processing, and therefore, should be extensively cleaned. In some embodiments, a combination of standard sonication is used in acetone then isopropyl alcohol followed by plasma ashing (e.g., exposure to oxygen plasma) to remove the particulates or other contamination from the substrates. Occasionally, laboratory grade detergent (liquinox) is used to remove particulates, if necessary, before the above processing.

After cleaning of the substrate, a hexamethyldisiloxane adhesion promoter deposited in a vacuum oven (i.e., vapor phase deposition). This processing step also demonstrates that the substrates are dry before photoresist application by holding them in vacuum at high temperatures.

In one embodiment, a AZ 2035 nLOF photoresist may be used. In such an embodiment, UV light is applied to cure the substrate (i.e., the polymer substrate) and allows the substrate to remain on the surface after development. A 2500 rpm spin speed may be used to produce approximately 3.5 micron film (i.e., greater than 3× the thickness of the dark mirror coating).

A soft bake (and post exposure bake) of the substrate may be conducted in a nitrogen atmosphere. The nitrogen atmosphere reduces the chance of oxidation during the abnormally long baking time. Since the photoresist does not require re-hydration, the nitrogen atmosphere will not negatively affect the processing time or results. The exposure, post-exposure bake, and development time are determined experimentally to produce the correct feature size.

Oxygen plasma processing may be used after the photoresist process to remove any residual contamination and promote the adhesion of the dark mirror coating. A short plasma processing time may be used so that the photoresist feature size and aspect ratio was not significantly altered.

Any residual particulates or unwanted photoresist are removed manually with tweezers. This is important since the desired film uniformity demanded zero pinholes so occasional defects in the photoresist (i.e., unwanted cured photoresist) can be removed manually.

The photolithography process described herein compensated for the optical and thermal differences between the IR filter substrates as compared to silicon wafers (which is the assumed substrate for most photolithography processes). It is also suspected that scattered light within the optic illuminated particulates on the surface and caused the unwanted photoresist development, which would later cause pinholes if not manually removed). A potential solution to these issues is a Bottom Anti-Reflective Coating (BARC) that suppress substrate reflections, which would simplify the UV dose tuning and this process should be attempted in follow-on efforts.

Dark Mirror—Optical Modeling and Deposition

Dark mirror coatings control stray light and help define the aperture of an optical system. Dark mirror coatings accomplish this by absorbing incoming light, meaning they are both non-reflective and non-transmissive. For a spectrometer, a patterned dark mirror may control the aperture of light incident upon the spectrograph.

These embodiments discuss a bi-directional dark mirror coating on the backside of a commercial bandpass filter. The backside of the filter may include an anti-reflective coating that serves as the base layer for the dark mirror coating.

Figure 2:
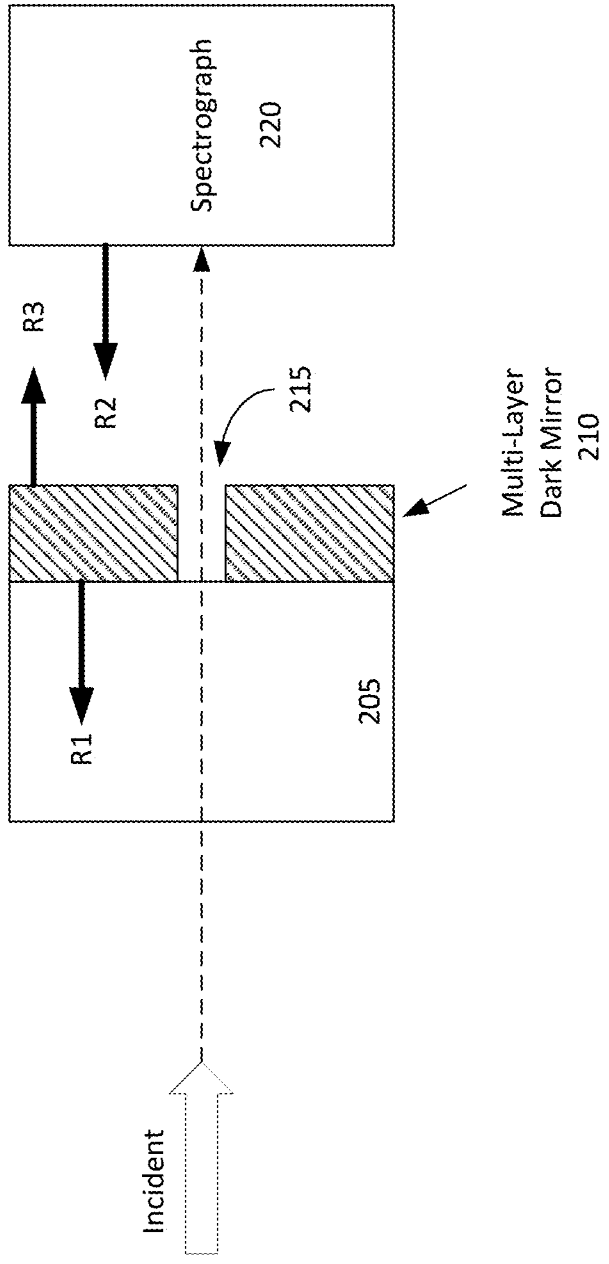
FIG. 2 is a diagram illustrating a system configured to suppress both frontside reflection and backside reflection, according to an embodiment of the present invention.

Some embodiments are directed to reduce frontside reflection to the prescribed 2% level determined from stray light analysis, while also minimizing backside reflection in VIS-NIR region, from 600-1650 nm. FIG. 2 is a diagram illustrating a system 200 configured to suppress both frontside reflection and backside reflection, according to an embodiment of the present invention. In this embodiment, system includes a substrate 205 with a multi-layer dark mirror 210 comprising one or more slits 215. Multi-layer dark mirror 210 may be a dark mirror coating, and one or more slits 215 in the coating (e.g., multi-layer dark mirror 210) allows incident light to pass through and reflect (R2) off another optical body (spectrograph) 220. Frontside reflection R3 is defined as light reflected off the top surface of dark mirror 210. Backside reflection R1 is defined as light reflected off the base of dark mirror 210.

Dark mirrors may employ metal coatings due to their high absorption. Dark mirrors are a combination of metals and anti-reflection coatings. In some embodiments, a bidirectional dark mirror is designed in a simulation software using $HfO_2$, Hf, and $SiO_2$. Hafnium (Hf) is selected based off its high refractive index; however, other dull metals may be used. Previous experience with thin (e.g., sub-10 nm) layers suggested that the optical properties of thin hafnium layers are significantly different from thick hafnium layers. The simulated designs accounted for these differences through direct experimental measurements of thin and "thick" hafnium by ellipsometry. The experimental data is imported into simulation software as distinct materials.

Figure 3:
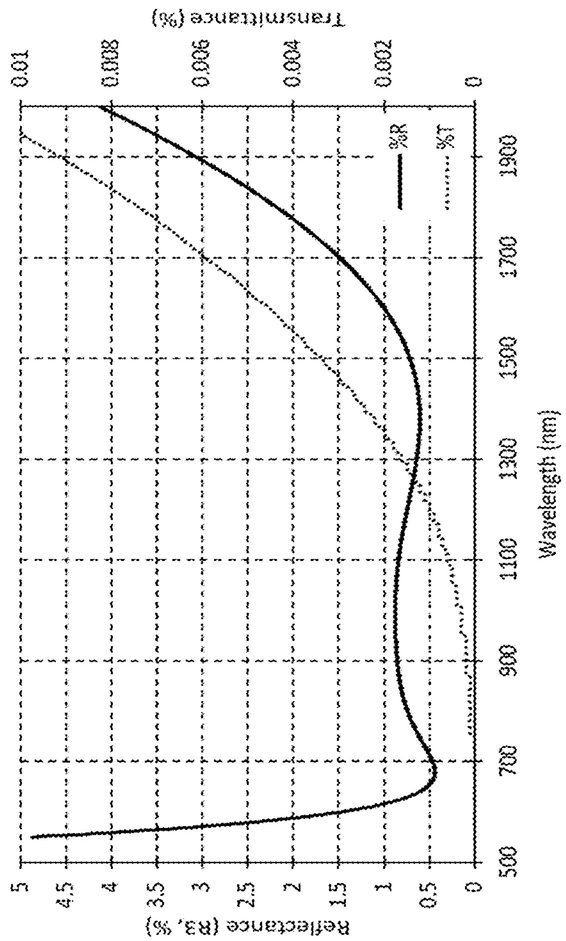
FIG. 3 is a graph illustrating a frontside reflectance (R3) for a 6 layer Hf/$SiO_2$ stack, according to an embodiment of the present invention.

In one embodiment, a "one-way" 6-layer Hf/$SiO_2$ design was created to reduce frontside reflection to negligible levels (e.g., less than one percent in some embodiments). The 6-layer design utilized a 4-layer anti-reflection coating built on top of a thick, and highly absorptive, hafnium layer. FIG. 3 is a graph 300 illustrating a frontside reflectance (R3) for a 6 layer Hf/$SiO_2$ stack, according to an embodiment of the present invention. In graph 300, the 6-layer design reduced frontside reflection to less than 1.5% across the wavelength range of interest. However, the 6-layer design did not address backside reflection.

Figure 4:
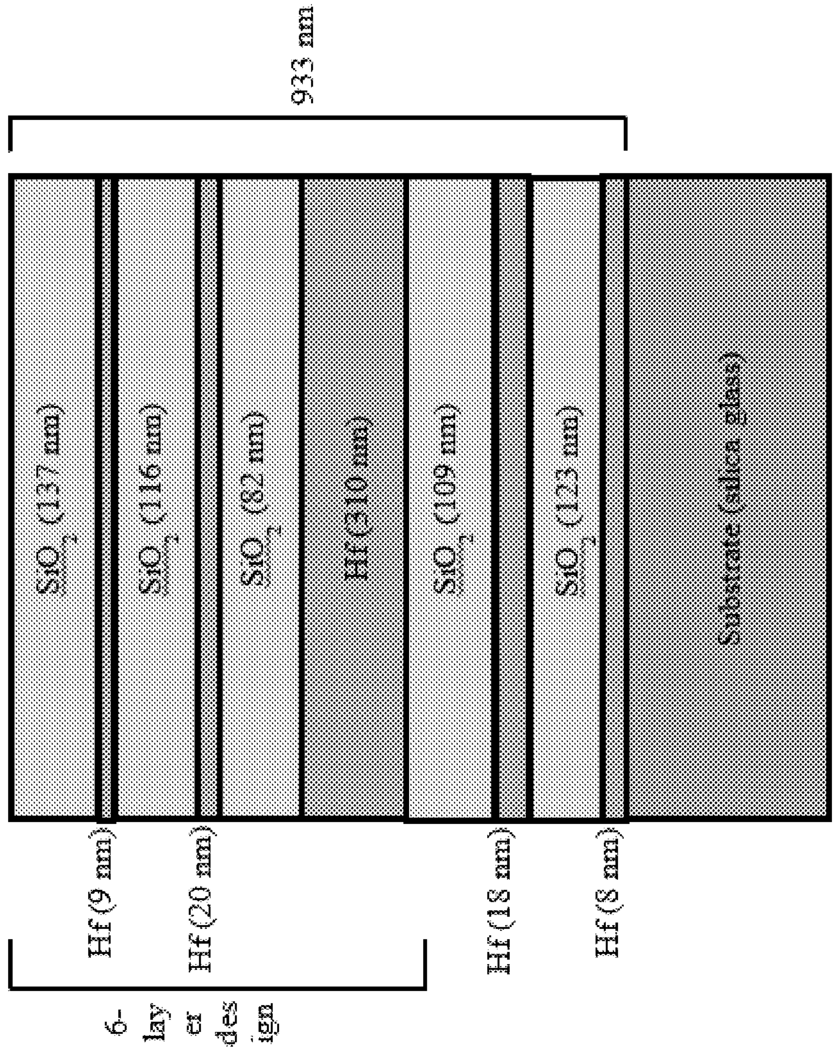
FIG. 4 is a diagram illustrating a 10 layer dark mirror, according to an embodiment of the present invention.

The 6-layer design may be modified into a bidirectional 10-layer design by taking the top 4 layers of the 6-layer design, and adding the layers to the base of the stack. The symmetric design may then be optimized for both reflection off the top surface and through the substrate. FIG. 4 is a diagram illustrating a 10 layer dark mirror 400, according to an embodiment of the present invention. In this embodiment, 10-layer dark mirror 400 is based off the 6-layer design with layers roughly symmetric about the 310 nm Hf layer. The thick 310 nm hafnium layer in the center acts as an absorptive barrier for incident light. Therefore, the top 5 layers affect frontside and the bottom 4 layers affect backside reflection.

The 10-layer design may be further modified into a 9-layer stack involving an $HfO_2$ base layer.

Figure 5:
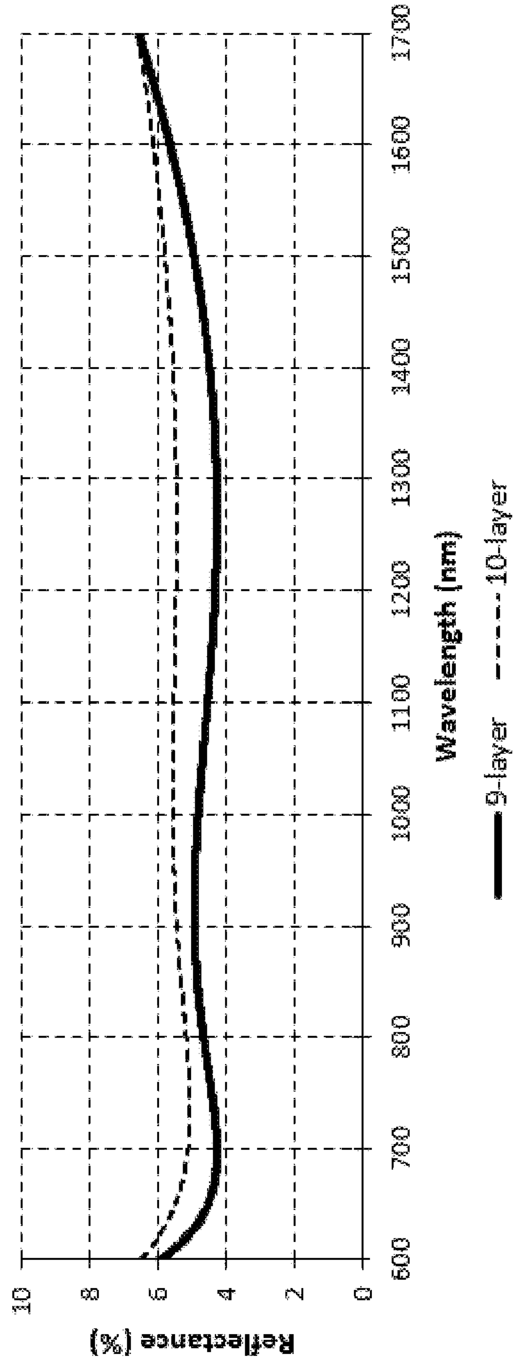
FIG. 5 is a graph illustrating backside reflectance (R1) for a 10-layer Hf/$SiO_2$ stack and 9-layer $HfO_2$/Hf/$SiO_2$ stack, according to an embodiment of the present invention.

Since hafnium oxide ($n \approx 2$) possesses a refractive index closer to glass ($n \approx 1.5$) than hafnium metal ($n \approx 3$) does, the replacement of metal for oxide at the base layer improves backside reflectance. FIG. 5 is a graph 500 illustrating backside reflectance (R1) for a 10-layer Hf/$SiO_2$ stack and 9-layer $HfO_2$/Hf/$SiO_2$ stack, according to an embodiment of the present invention. In this embodiment, graph 500 shows improvements to backside reflectance across the wavelength range of interest. However, spectral differences between the two are minimal for frontside reflectance. Again, this is due to the large 310 nm hafnium layer nestled in the center of the coating that acts as an absorptive barrier.

Figure 6:
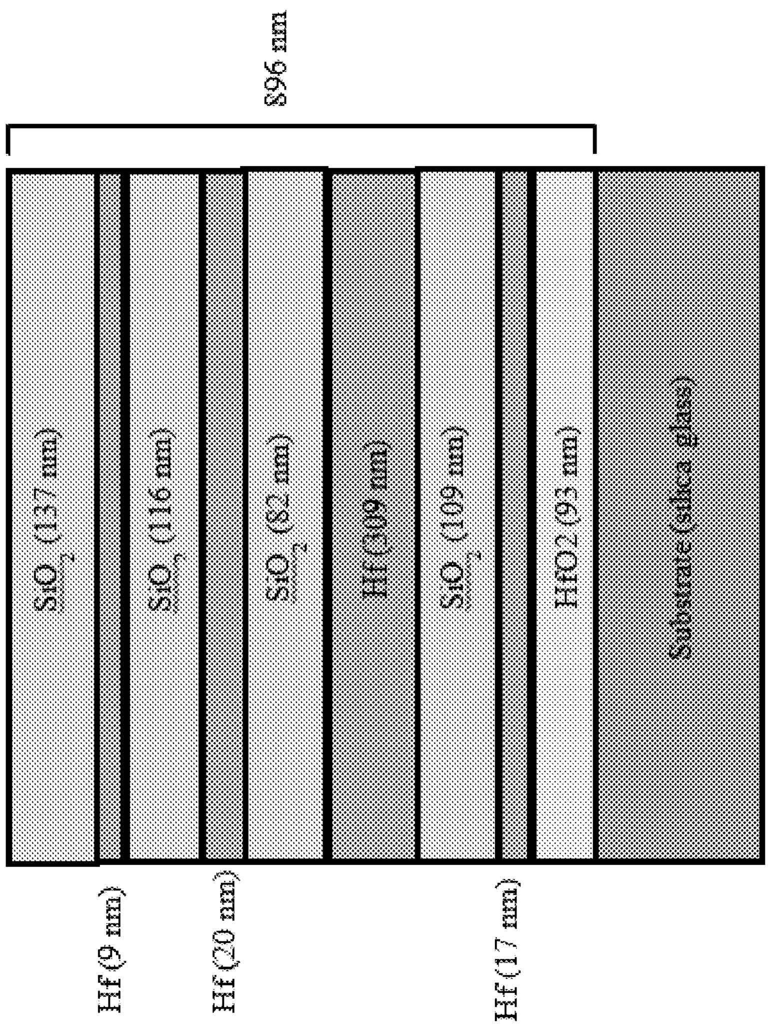
FIG. 6 is a diagram illustrating a 9 layer dark mirror, according to an embodiment of the present invention.

From 600-1650 nm, average reflectance through the substrate reduced from 5.5% to 4.7%. Given its better performance on the backside, the 9-layer design is selected as the final choice for deposition. FIG. 6 is a diagram illustrating a 9 layer dark mirror 600, according to an embodiment of the present invention. 9 layer dark mirror 600 may be used for superior performance in both frontside (R3) and backside (R1) reflectance.

Reactive magnetron sputtering may create the dark mirror coating, with hafnium and silicon targets. Argon gas may be used as the sputtering gas, with oxygen flow for oxides controlled by a residual gas analyzer (RGA). Prior to dark mirror depositions, calibration runs are performed using ellipsometry and transmission data to confirm deposition rates for hafnium, hafnium oxide, and silicon oxide. As noted, thin layers (sub-10 nm) may necessitate their own calibrations as they differ from "thick" coatings. Furthermore, 4-layer stacks composed of thin Hf/silica/thick Hf/silica were deposited to ensure the accuracy of thin and thick hafnium. These samples were measured in reflection and compared to software simulations for validation.

Four separate coating runs were performed, with 3 dark mirror samples plus 1 fused silica witness sample in each. To cycle between hafnium oxide and hafnium metal, oxygen flow was set to 0 for metal layers. Stabilization time between layers was increased to at least 5 minutes to allow oxygen levels within the chamber to stabilize.

Figure 7:
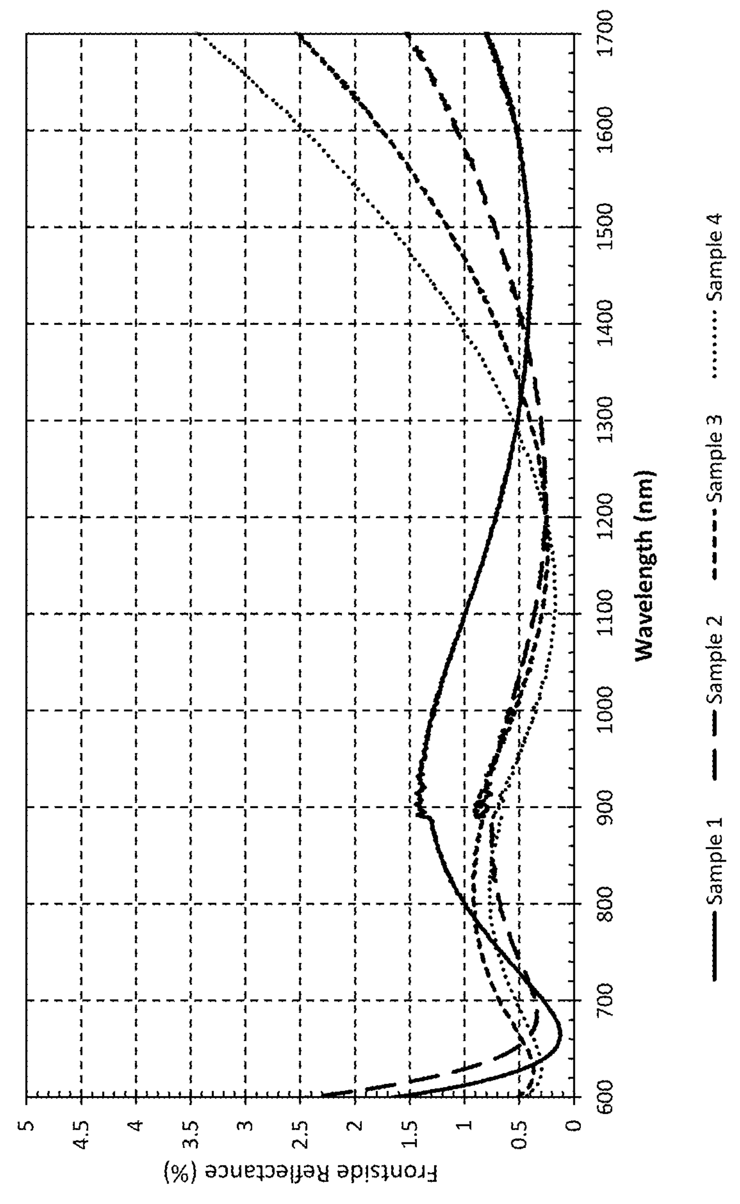
FIG. 7 is a graph illustrating frontside reflectance (R3) for all dark mirror deposition runs, according to an embodiment of the present invention.

1" fused silica witness samples were used in every deposition for reflection measurements. The Perkin-Elmer Lambda 950 with Universal Reflectance Accessory (URA) was used to measure the witness samples. FIG. 7 is a graph 700 illustrating frontside reflectance (R3) for all dark mirror deposition runs, according to an embodiment of the present invention. It is clear from the spectra that the chamber conditions used in these coatings were not conducive to repeatability. The source for this discrepancy is tied to the oxygen levels used during depositions. Specifically, oxygen levels for the silica layers resulted in continual poisoning of the target, wherein oxygen binds with the silicon target to form an oxide surface layer. This was unexpected behavior since silica deposition is traditionally a very stable process. Despite this, the final spectra were suitable for spectrometer, so re-calibrations were not performed.

Figure 8:
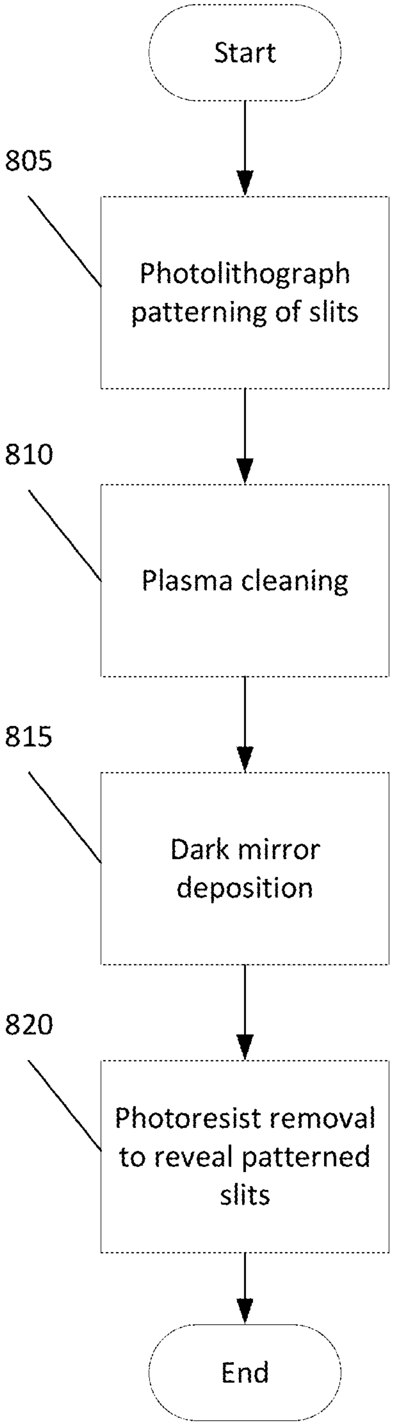
FIG. 8 is a flow diagram illustrating a method for fabricating an optical slit mask for a spectrometer according to an embodiment of the present invention.

FIG. 8 is a flow diagram illustrating method 800 for fabricating an optical slit mask for a spectrometer according to an embodiment of the present invention. In some embodiments, method 800 includes patterning one or more slits on a substrate using photolithography at 805. At 810, method 800 includes cleaning and processing of the substrate, which may include performing oxygen plasma processing after the photoresist process to remove any residual contamination and promote the adhesion of the dark mirror coating, and at 815, depositing dark mirror coatings. Finally, method 800 at 820 the photoresist is removed in a lift-off procedure to reveal the slits in the dark mirror coating.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method, comprising:

patterning one or more slits on a substrate using photolithography;

cleaning and processing of the substrate;

depositing dark mirror coatings; and removing photoresist from the substrate in a lift-off procedure to reveal the one or more slits in the dark mirror coatings.

2. The method of claim 1, wherein the cleaning and processing of the substrate comprises removing residual contamination and promoting an adhesion of the dark mirror coating.

3. The method of claim 2, wherein the removing residual contamination and the promoting the adhesion comprises performing oxygen plasma processing after removal of the photoresist.

4. The method of claim 1, further comprising:

cleaning a slit mask substrate, wherein the cleaning of the slit mask substrate comprises 5 minutes sonication of the substrate in acetone, 5 minute sonication of the substrate in isopropyl alcohol (IPA), de-ionized (DI) water rinse of the of the substrate, inspect for particulate or visual contamination, and remove with oxygen plasma Asher for 10 minutes at 150 W, and if particulates, persist cleaning with detergent and repeat acetone/IPA/DI water rinse.

5. The method of claim 4, further comprising:

performing hexamethyldisiloxane (HDMS) deposition of the substrate, wherein the performing the HDMS deposition comprises baking the substrate at 140 C in a HDMS oven for 10 minutes, opening an HDMS valve for additional 10 minutes, and allowing the substrate to cool approximately 10 minutes before performing a photoresist application.

6. The method of claim 5, further comprising:

performing spin coating of the substrate, wherein the performing the spin coating comprises applying room temperature to the substrate, and applying the substrate on a spin coater, producing a photoresist thickness greater than two times a film thickness to be deposited.

7. The method of claim 6, further comprising:

soft baking the substrate at 110 C for 60 minutes in nitrogen atmosphere;

exposing the substrate at 100 mJ/cm2 in contact mode;

post exposure baking of the substrate for 16 minutes at 110 C in nitrogen atmosphere; and developing photoresist material.

8. The method of claim 7, wherein the developing the photoresist material comprises performing three (3) minutes of soaking the substrate in a developer;

rinsing the substrate in dionized (DI) water;

performing N2 blow dried to remove residual water; and performing two (2) minutes of O2 plasma at 1 Torr and 100 W power to remove trace the photoresist material and promote adhesion of the dark mirror coating.

9. A method, comprising:

patterning one or more slits on a substrate using photolithography;

cleaning and processing of the substrate, wherein the cleaning and processing of the substrate comprises removing residual contamination and promoting an adhesion of the dark mirror coating;
depositing dark mirror coatings; and
removing photoresist from the substrate in a lift-off procedure to reveal the one or more slits in the dark mirror coatings.

10. The method of claim 9, wherein the removing residual contamination and the promoting the adhesion comprises
performing oxygen plasma processing after removal of the photoresist.

11. The method of claim 9, further comprising:
cleaning a slit mask substrate, wherein the cleaning of the slit mask substrate comprises
5 minutes sonication of the substrate in acetone,
5 minute sonication of the substrate filter in isopropyl alcohol (IPA),
de-ionized (DI) water rinse of the of the substrate,
inspect for particulate or visual contamination, and
remove with oxygen plasma Asher for 10 minutes at 150 W, and
if particulates, persist cleaning with detergent and repeat acetone/IPA/DI water rinse.

12. The method of claim 11, further comprising:
performing hexamethyldisiloxane (HDMS) deposition of the substrate, wherein
the performing the HDMS deposition comprises baking the substrate at 140 C in a HDMS oven for 10 minutes, opening an HDMS valve for additional 10 minutes, and allowing the substrate to cool approximately 10 minutes before performing a photoresist application.

13. The method of claim 12, further comprising:
performing spin coating of the substrate, wherein
the performing the spin coating comprises applying room temperature to the substrate, and applying the substrate on a spin coater, producing a photoresist thickness greater than two times a film thickness to be deposited.

14. The method of claim 13, further comprising:
soft baking the substrate at 110 C for 60 minutes in nitrogen atmosphere;
exposing the substrate at 100 mJ/cm2 in contact mode;
post exposure baking of the substrate for 16 minutes at 110 C in nitrogen atmosphere; and
developing a photoresist material.

15. The method of claim 14, wherein the developing the photoresist material comprises
performing three (3) minutes of soaking the substrate in a developer;
rinsing the substrate in dionized (DI) water;
performing N2 blow dried to remove residual water; and
performing two (2) minutes of O2 plasma at 1 Torr and 100 W power to remove trace the photoresist material and promote adhesion of the dark mirror coating.

16. A method, comprising:
patterning one or more slits on a substrate using photolithography;
cleaning and processing of the substrate;
depositing dark mirror coatings; and
removing photoresist from the substrate in a lift-off procedure to reveal the one or more slits in the dark mirror coatings wherein the removing residual contamination and the promoting the adhesion comprises
performing oxygen plasma processing after removal of the photoresist.

17. The method of claim 16, wherein the removing residual contamination and the promoting the adhesion comprises
performing oxygen plasma processing after the photoresist process.

18. The method of claim 16, further comprising:
cleaning a slit mask substrate, wherein the cleaning of the slit mask substrate comprises
5 minutes sonication of the substrate in acetone,
5 minute sonication of the substrate in isopropyl alcohol (IPA),
de-ionized (DI) water rinse of the of the substrate,
inspect for particulate or visual contamination, and
remove with oxygen plasma Asher for 10 minutes at 150 W, and
if particulates, persist cleaning with detergent and repeat acetone/IPA/DI water rinse.

19. The method of claim 18, further comprising:
performing hexamethyldisiloxane (HDMS) deposition of the substrate, wherein
the performing the HDMS deposition comprises baking the substrate at 140 C in a HDMS oven for 10 minutes, opening an HDMS valve for additional 10 minutes, and allowing the substrate to cool approximately 10 minutes before performing a photoresist application.

20. The method of claim 19, further comprising:
performing spin coating of the substrate, wherein
the performing the spin coating comprises applying room temperature to the substrate, and applying the substrate on a spin coater, producing a photoresist thickness greater than two times a film thickness to be deposited.

21. The method of claim 20, further comprising:
soft baking the substrate at 110 C for 60 minutes in nitrogen atmosphere;
exposing the substrate at 100 mJ/cm2 in contact mode;
post exposure baking of the substrate for 16 minutes at 110 C in nitrogen atmosphere; and
developing photoresist material.

22. The method of claim 21, wherein the developing the photoresist material comprises
performing three (3) minutes of soaking the substrate in a developer;
rinsing the substrate in dionized (DI) water;
performing N2 blow dried to remove residual water; and
performing two (2) minutes of O2 plasma at 1 Torr and 100 W power to remove trace the photoresist material and promote adhesion of the dark mirror coating.

* * * * *